(12) United States Patent
Hong et al.

(10) Patent No.: US 8,749,023 B2
(45) Date of Patent: Jun. 10, 2014

(54) RESISTANCE-VARIABLE MEMORY DEVICE AND A PRODUCTION METHOD THEREFOR

(75) Inventors: Jin Pyo Hong, Seoul (KR); Young Ho Do, Seoul (KR); June-Sik Kwak, Gyeonggi-do (KR); Yoon Cheol Bae, Gyeongsangnam-do (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 13/318,024

(22) PCT Filed: Apr. 8, 2010

(86) PCT No.: PCT/KR2010/002153
§ 371 (c)(1),
(2), (4) Date: Oct. 28, 2011

(87) PCT Pub. No.: WO2010/126232
PCT Pub. Date: Nov. 4, 2010

(65) Prior Publication Data
US 2012/0049147 A1 Mar. 1, 2012

(30) Foreign Application Priority Data
Apr. 28, 2009 (KR) .................. 10-2009-0037123

(51) Int. Cl.
*H01L 29/00* (2006.01)
(52) U.S. Cl.
USPC .................. 257/537; 257/E27.006; 438/385; 365/148
(58) Field of Classification Search
USPC .................. 257/536, 537, E27.006; 438/385; 365/148
See application file for complete search history.

(56) References Cited

U.S. PATENT DOCUMENTS

2005/0250295 A1* 11/2005 Mita .............................. 438/460

FOREIGN PATENT DOCUMENTS

| KR | 10-2005-0017394 A | 2/2005 |
|---|---|---|
| KR | 10-2005-0105297 A | 11/2005 |
| KR | 10-2006-0023860 A | 3/2006 |
| KR | 10-2006-0083368 A | 7/2006 |
| KR | 10-2006-0106035 A | 10/2006 |
| KR | 10-2007-0005040 A | 1/2007 |

OTHER PUBLICATIONS

Machine Translation of Applicant Submitted Prior Art Korean Publication KR 10-2005-0105297.*
English translation of Abstract for 10-2005-0105297, 1 page.
English translation of Abstract for 10-2006-0083368, 1 page.
English translation of Abstract for 10-2007-0005040, 1 page.
English translation of Abstract for 10-2006-0023860, 1 page.
English translation of Abstract for 10-2006-0106035, 1 page.
English translation of Abstract for 10-2005-0017394, 1 page.
International Search Report issued in PCT/KR2010/002153, mailed on Nov. 8, 2010, 3 pages.
Written Opinion issued in PCT/KR2010/002153, mailed on Nov. 8, 2010, 4 pages.

* cited by examiner

*Primary Examiner* — Amar Movva
(74) *Attorney, Agent, or Firm* — Osha Liang LLP

(57) ABSTRACT

Disclosed are a ReRAM, which is a non-volatile memory device, and a production method therefor. A resistance-variable layer, which varies the resistance in accordance with an applied pulse, has a multilayered structure comprising 3 oxide films. Each oxide film consists of an oxide film of the same type as the neighbouring oxide film(s), but the oxygen ratios in the compositions of neighbouring oxide films differ from each other.

8 Claims, 3 Drawing Sheets

RESISTANCE-VARIABLE MEMORY DEVICE AND A PRODUCTION METHOD THEREFOR

TECHNICAL FIELD

The present invention relates to a nonvolatile memory and, more particularly, to a resistive random access memory (ReRAM) device and a method for producing the same.

BACKGROUND ART

Recently, with the recent development of digital information communication and electronics industries, research on memory devices such as DRAMs or flash memories based on charge control is expected to reach its limitations. To overcome the limitations, research on new memory devices using a phase change, a change in magnetic field, etc. has progressed. The new memory devices under research store information using the principle that the resistance of a material is changed by a change in state of the material.

In the case of a flash memory as a representative of nonvolatile memory devices, a high operating voltage is required to write or erase data. Thus, when the flash memory is scaled down below 65 nm, there may be some limitations due to interference between adjacent cells, and the slow operating speed and high power consumption are still problematic.

Among various nonvolatile memory devices which have recently been developed, a ferroelectric RAM (FeRAM) has a problem of material instability, and a magnetic RAM (MRAM) has problems of complex manufacturing process, complex multilayer structure, and low margin of write/read operations. Thus, the development of next generation nonvolatile memory technology capable of replacing these memory devices will be a key area of research.

A resistive random access memory (hereinafter referred to as "ReRAM") implements the operation of the memory using the phenomenon that the resistance of a thin film is changed by a voltage applied to the thin film. The ReRAM has outstanding advantages of no deterioration due to continuous recording and reproducing of data, operability at high temperature, nonvolatile properties, and stability of data. Moreover, when an input pulse is applied to the ReRAM, it can operate at a high speed of about 10 to 20 ns with a resistance change of about 1,000 times.

Most of the ReRAM devices have a resistance-variable layer with a single film structure, and thus the ReRAM devices have advantages of high integration and high operation speed. Moreover, the existing CMOS process and integration process technologies can be applied to the resistance-variable layer. An oxide is used as a material for the resistance-variable layer and, in particular, a binary oxide or perovskite oxide is used. Recently, a perovskite oxide doped with metal is used.

Korean Patent Publication No. 10-2006-0083368 discloses a ReRAM with a multilayer film comprising metal oxides having different composition ratios, in which $NiO_x$, $HfO_x$, $TiO_x$, $Ta_2O_x$, $Al_2O_x$, $La_2O_x$, $Nb_2O_x$, $SrTiO_x$, Cr-doped $SrTiO_x$, or Cr-doped $SrZrO_x$ (where x is 1.5 to 1.9) is used as the metal oxides.

Korean Patent Publication No. 10-2006-0106035 discloses a ReRAM device comprising a perovskite oxide of Cr-doped $SrZr_3$ as a resistive layer.

Moreover, Korean Patent Publication No. 10-2004-0063600 mentions a ReRAM device, in which a barrier layer of Ta, TaN, Ti, TiN, TaAlN, TiSiN, TaSiN, TiAl or TiAl is formed on an Ir substrate and a thin film of $Pr_{0.7}Ca_{0.3}MnO_3$ (hereinafter referred to as "PCMO") as a resistive layer is formed on the barrier layer. The ReRAM device is prepared by repeating coating, baking and annealing processes until a PCMO layer has a desired thickness, and thus the entire process is very complicated. Moreover, the main processes are performed under atmospheric conditions, which may affect the characteristics of ReRAM due to oxidation and surface contamination and may impose limitations on the stabilization of thin films. Moreover, it is difficult to ensure excellent reproducibility due to the instability of operating voltage and resistance caused by difficulties in controlling the stability of the point defect structure in oxide thin films for ReRAMs produced by the above-mentioned inventions, and it is further difficult to provide stabilization of device operation due to process limitations.

Therefore, it is necessary to develop a nonvolatile memory device, which can be produced by a simple process, can have various resistances by controlling the operating voltage, has no possibility of surface contamination, and thus can be applied in various application fields.

DISCLOSURE

Technical Problem

To solve the above-described problems, a first object of the present invention is to provide a ReRAM device comprising multi-layered oxide films, which are formed of the same type of oxide and have high efficiency and excellent reproducibility, thereby implementing a multi-level memory device.

Moreover, a second object of the present invention is to provide a method for producing a ReRAM device to achieve the first object.

Technical Solution

According to an aspect of the present invention to achieve the first object of the present invention, there is provided a resistive random access memory (ReRAM) device comprising: a substrate; a lower electrode formed on the substrate; a resistance-variable layer comprising a first oxide film, a second oxide film, and a third oxide film, which are sequentially stacked on the lower electrode and formed of the same type of oxide, and in which adjacent oxide films have different compositions ratios; and an upper electrode formed on the resistance-variable layer.

According to another aspect of the present invention to achieve the second object of the present invention, there is provided a method for producing a resistive random access memory (ReRAM) device, the method comprising: forming a lower electrode on a substrate; forming a first oxide film on the lower electrode; forming a second oxide film on the first oxide film, the second oxide film being formed of the same type of oxide as the first oxide film and having a composition ratio different from that of the first oxide film; forming a third oxide film on the second oxide film, the third oxide film being formed of the same type of oxide as the second oxide film and having a composition ratio different from that of the second oxide film; and forming an upper electrode on the third oxide film.

Advantageous Effects

As described above, the resistance-variable layer of the ReRAM device comprises the oxide films, which are formed of the same type of oxide, and in which adjacent oxide films have different composition ratios. Thus, an additional process such as a cleaning process after forming an oxide film is not required to form another type of oxide film. As a result, it is possible to form the resistance-variable layer by an easy and simple process.

Moreover, it is possible to implement a multi-level memory device in the operation aspects, and thus it is possible to achieve a multi-level cell (MLC) device capable of storing a variety of information in a cell.

MODE FOR INVENTION

Figure 1:
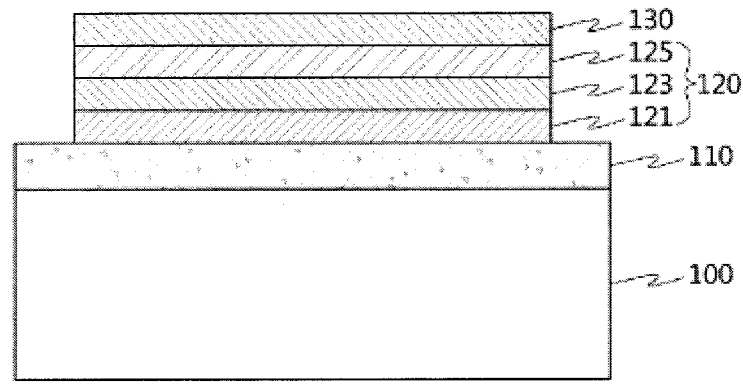
FIG. 1 is a cross-sectional view showing a ReRAM in accordance with an exemplary embodiment of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

Unless otherwise defined, all terms, including technical and scientific terms, used herein have the same meaning as commonly understood by one of ordinary skill in the art to which this invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in more detail with reference to the accompanying drawings.

EXAMPLE 1

FIG. 1 is a cross-sectional view showing a ReRAM in accordance with an exemplary embodiment of the present invention.

Referring to FIG. 1, a ReRAM according to this Example includes a substrate 100, a lower electrode 110 disposed on the substrate 100, a resistance-variable layer 120 disposed on the lower electrode 110, and an upper electrode 130 disposed on the resistance-variable layer 120.

In particular, the resistance-variable layer 120 comprises a first oxide film 121, a second oxide film 123, and a third oxide film 125, which are formed of the same type of oxide, and in which adjacent oxide films have different composition ratios.

First, the substrate 100 may be any substrate which can be applied to a typical semiconductor memory device without limitation. Examples of commonly used substrates include a Si, $SiO_2$, or $Si/SiO_2$ multilayer substrate or a silicon substrate.

The lower electrode 110 comprises at least one selected from the group consisting of Pt, Au, Al, Cu, Ti, and alloys thereof, a nitride electrode material such as TiN, WN, etc., and an oxide electrode material such as $In_2O_3$:Sn (ITO), $SnO_2$:F (FTO), $SrTiO_3$, $LaNiO_3$, etc. The lower electrode 110 may be formed to a thickness of 5 to 500 nm depending on the type of electrode material used.

Moreover, the resistance-variable layer 120 comprises three oxide films 121, 123 and 125, which are formed of the same type of oxide, and in which adjacent oxide films have different composition ratios. That is, the adjacent oxide films have different composition ratios of metal to oxygen. The oxide films having different composition ratios may be one selected from the group consisting of $TiO_2$ ($TiO_{2-x}$), MgO ($MgO_{1-x}$), NiO ($NiO_{1-x}$), ZnO ($ZnO_{1-x}$), $HfO_2$ ($HfO_{2-x}$), and combinations thereof, and preferably $TiO_2$ ($TiO_{2-x}$). Here, x is preferably set to 0.6 to 1 in $TiO_{2-x}$ and $HfO_{2-x}$ and 0.3 to 0.7 in $MgO_{1-x}$, $NiO_{1-x}$, and $ZnO_{1-x}$. That is, a composition which satisfies the stoichiometry and a composition which does not satisfy the stoichiometry are alternately stacked in the resistance-variable layer 120, which means that the resistance-variable layer 120 has a structure in which a stoichiometric layer and a nonstoichiometric layer are repeatedly stacked. Thus, the first oxide film 121 may be a stoichiometric layer, the second oxide film 123 may be a nonstoichiometric layer, and the third oxide film 125 may be a stoichiometric layer. Otherwise, the first oxide film 121 may be a nonstoichiometric layer, the second oxide film 123 may be a stoichiometric layer, and the third oxide film 125 may be a nonstoichiometric layer.

For example, the first oxide film 121 may comprise $TiO_2$, the second oxide film 123 may comprise $TiO_{2-x}$, and the third oxide film 125 may comprise $TiO_2$. Otherwise, the first oxide film 121 may comprise $TiO_{2-x}$, the second oxide film 123 may comprise $TiO_2$, and the third oxide film 125 may comprise $TiO_{2-x}$.

Therefore, the resistance-variable layer 120 comprising the three oxide films may be one selected from the group consisting of $TiO_2/TiO_{2-x}/TiO_2$, $TiO_{2-x}/TiO_2/TiO_{2-x}$, $MgO/MgO_{1-x}/MgO$, $MgO_{1-x}/MgO/MgO_{1-x}$, $NiO/NiO_{1-x}/NiO$, $NiO_{1-x}/NiO/NiO_{1-x}$, $ZnO/ZnO_{1-x}/ZnO$, $ZnO_{1-x}/ZnO/ZnO_{1-x}$, $HfO_2/HfO_{2-x}/HfO_{2-x}$, and $HfO_{2-x}/HfO_2/HfO_{2-x}$, and preferably $TiO_{2-x}/TiO_2/TiO_{2-x}$ or $TiO_2/TiO_{2-x}/TiO_2$. The resistance-variable layer 120 comprising these oxides is to improve the operating characteristics and implement a multi-level memory device, compared to a perovskite oxide and a binary oxide adopted as a resistance-variable layer of a conventional nonvolatile ReRAM device.

According to the present invention, in the oxide films that constitute the resistance-variable layer 120, it is possible to change the resistance between set and reset states of the memory device by changing the thickness of each oxide film. In more detail, it is possible to change the resistance of the entire resistance-variable layer 120 due to a change in the amount of oxygen exchanged between the oxide containing a relatively large amount of oxygen, which corresponds to the stoichiometric layer causing a resistance change in the resistant-variable layer 120, and the oxide containing a relatively large amount of metal, which corresponds to the nonstoichiometric layer, by the change in thickness of the first oxide film 121, the second oxide film 123, and the third oxide film 125. Thus, based on the change in resistance, the ReRAM of the present invention can be utilized as a highly efficient memory device.

The total thickness of the resistance-variable layer 120 comprising the three oxide films is 5 to 150 nm, and preferably 10 to 70 nm. If the thickness of the resistance-variable layer 120 is less than 5 nm, the set/reset voltage as the operating voltage becomes unstable, whereas, if it exceeds 70 nm, the problem of unstable operation occurs due to an excessive increase in operating voltage.

Moreover, it is preferred that the thickness of the first oxide film 121 is set to 2 to 10 nm, the thickness of the second oxide film 123 is set to 6 to 50 nm, and the thickness of the third oxide film 125 is set to 2 to 10 nm.

Furthermore, according to the present invention, in the oxide films that constitute the resistance-variable layer 120, it is possible to change the resistance between set and reset states of the memory device by changing the composition of oxygen in each oxide film. In more detail, it is possible to change the resistance of the entire resistance-variable layer 120 due to a change in the amount of oxygen exchanged between the oxide containing a relatively large amount of oxygen, which corresponds to the stoichiometric layer causing a resistance change in the resistant-variable layer 120, and the oxide containing a relatively large amount of metal, which corresponds to the nonstoichiometric layer, by the change in the composition of oxygen in the first oxide film 121, the second oxide film 123, and the third oxide film 125. Thus, based on the change in resistance, the ReRAM of the present invention can be utilized as a highly efficient memory device.

The oxide films having different composition ratios may be one selected from the group consisting of $TiO_2$ ($TiO_{2-x}$), MgO ($MgO_{1-x}$), NiO ZnO ($ZnO_{1-x}$), $HfO_2$ ($HfO_{2-x}$), and combinations thereof, and preferably $TiO_2$ ($TiO_{2-x}$). Here, x is preferably set to 0.6 to 1 in $TiO_{2-x}$ and $HfO_{2-x}$ and 0.3 to 0.7 in $MgO_{1-x}$, $NiO_{1-x}$, and $ZnO_{1-x}$. If x is less than 0.6 in $TiO_{2-x}$ and $HfO_{2-x}$ and 0.3 in $MgO_{1-x}$, $NiO_{1-x}$, and $ZnO_{1-x}$, the difference in oxygen ions between the stoichiometric layer and the nonstoichiometric layer is small, and thus the migration of oxygen ions according to the resistance change is insignificant. On the contrary, if x exceeds 1 in $TiO_{2-x}$ and $HfO_{2-x}$ and 0.7 in $MgO_{1-x}$, $NiO_{1-x}$, and $ZnO_{1-x}$, the oxide film as the nonstoichiometric layer exhibits the characteristics of metal rather than the characteristics of the oxide film, and thus the problem of unstable operation occurs.

The upper electrode 130 is formed of the same material as or a different material from the lower electrode 110. The upper electrode 130 comprises at least one selected from the group consisting of Pt, Au, Al, Cu, Ti, and alloys thereof, a nitride electrode material such as TiN, WN, etc., and an oxide electrode material such as $In_2O_3$:Sn (ITO), $SnO_2$:F (FTC), $SrTiO_3$, $LaNiO_3$, etc. The upper electrode 130 may be formed to a thickness of 5 to 500 nm depending on the type of electrode material used. The upper electrode 130 has a micro-patterned structure using a shadow mask or by a dry etching process.

Figure 2:
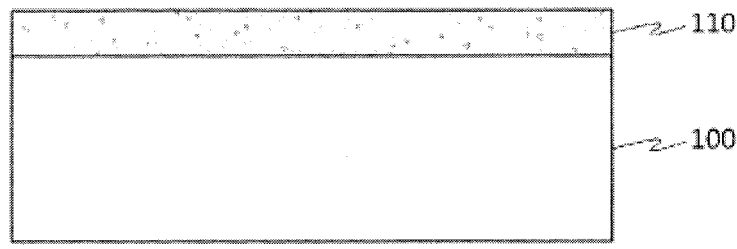
FIGS. 2 to 4 are cross-sectional views showing a method for producing a ReRAM in accordance with another exemplary embodiment of the present invention.
Figure 3:
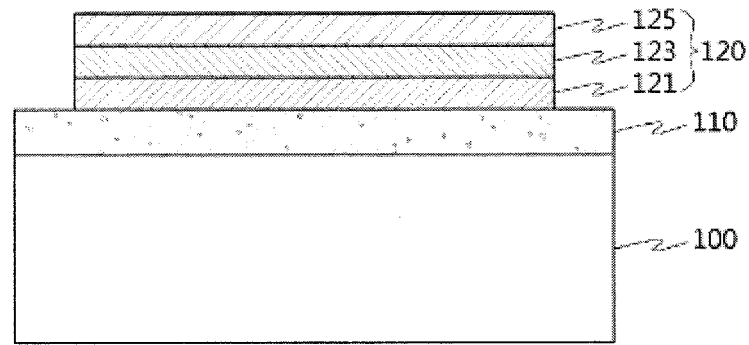
Figure 4:
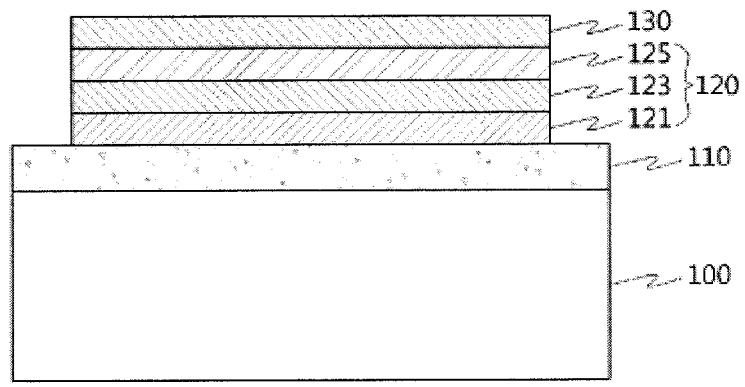

FIGS. 2 to 4 are cross-sectional views showing a method for producing a ReRAM in accordance with another exemplary embodiment of the present invention.

Referring to FIG. 2, a lower electrode 110 is formed on a substrate 100.

The lower electrode 110 is formed of at least one selected from the group consisting of Pt, Au, Al, Cu, Ti, and alloys thereof, a nitride electrode material such as TiN, WN, etc., and an oxide electrode material such as $In_2O_3$:Sn (ITO), $SnO_2$:F (FTC), $SrTiO_3$, $LaNiO_3$, etc. by an ordinary deposition method.

Examples of the deposition method may include physical vapor deposition, chemical vapor deposition, sputtering, pulsed laser deposition, thermal evaporation, electron beam evaporation, atomic layer deposition, molecular beam epitaxy, etc.

Referring to FIG. 3, a resistance-variable layer 120 comprising oxide films, which are formed of the same type of oxide, and in which adjacent oxide films have different composition ratios.

The resistance-variable layer 120 is formed by sequentially forming a first oxide film 121, a second oxide film 123, and a third oxide film 125. Moreover, adjacent oxide films have different composition ratios of metal to oxygen. That is, if the first oxide film 121 and the third oxide film 125 comprise a stoichiometric layer which satisfies the stoichiometry, the second oxide film 123 comprises a nonstoichiometric layer having a lower composition of oxygen. Otherwise, if the first oxide film 121 and the third oxide film 125 comprise a non-stoichiometric layer, the second oxide film 123 comprises a stoichiometric layer. Moreover, the first to third oxide films 121, 123 and 125 of the resistance-variable layer 120 have different compositions of oxygen to provide a more highly efficient device. That is, the composition ratios of the first to third oxide films 121, 123 and 125 are different from each other such that oxygen ions migrating to the interface are different, and thus it is possible to produce a highly efficient device having various resistances.

Therefore, the resistance-variable layer 120 may be one selected from the group consisting of $TiO_2/TiO_{2-x}/TiO_2$, $TiO_{2-x}/TiO_2/TiO_{2-x}$, $MgO/MgO_{1-x}/MgO$, $MgO_{1-x}/MgO/MgO_{1-x}$, $NiO/NiO_{1-x}/NiO$, $NiO_{1-x}/NiO/NiO_{1-x}$, $ZnO/ZnO_{1-x}/ZnO$, $ZnO_{1-x}/ZnO/ZnO_{1-x}$, $HfO_2/HfO_{2-x}/HfO_2$, and $HfO_{2-x}/HfO_2/HfO_{2-x}$, and preferably $TiO_{2-x}/TiO_2/TiO_{2-x}$ or $TiO_2/TiO_{2-x}/TiO_2$.

In the resistance-variable layer 120 comprising the oxide films, which are formed of the same type of oxide, and in which adjacent oxide films have different composition ratios, it is possible to change the resistance between set and reset states of the memory device by changing the thickness of each oxide film. In particular, it is possible to change the resistance of the entire resistance-variable layer 120 due to a change in the amount of oxygen exchanged between the oxide containing a relatively large amount of oxygen, which causes a resistance change in the resistant-variable layer 120, and the oxide containing a relatively large amount of metal by the change in thickness of t1, t2 and t3 in $TiO_{2-x}$ (thickness t1)/$TiO_2$ (thickness t2)/$TiO_{2-x}$ (thickness t3) or $TiO_2$ (thickness t1)/$TiO_{2-x}$ (thickness t2)/$TiO_2$ (thickness t3). Thus, based on the change in resistance, the ReRAM of the present invention can be utilized as a highly efficient memory device. The resistance-variable layer 120 comprising the three oxide films has a thickness of 5 to 150 nm, and preferably 10 to 70 nm. Moreover, according to the present invention, in the oxide films that constitute the resistance-variable layer 120, it is possible to change the resistance between set and reset states of the memory device by changing the composition of oxygen in each oxide film. In more detail, it is possible to change the resistance of the entire resistance-variable layer 120 due to a change in the amount of oxygen exchanged between the oxide containing a relatively large amount of oxygen, which corresponds to the stoichiometric layer causing a resistance change in the resistant-variable layer 120, and the oxide containing a relatively large amount of metal, which corresponds to the nonstoichiometric layer, by the change in the composition of oxygen in the first oxide film 121, the second oxide film 123, and the third oxide film 125. Thus, based on the change in resistance, the ReRAM of the present invention can be utilized as a highly efficient memory device.

The oxide films that constitute the resistance-variable layer 120 may be formed by the same method as the above-mentioned lower electrode 110 or by one of the methods.

Then, heat treatment is performed on the substrate 100 on which the resistance-variable layer 120 is formed.

The heat treatment is performed in a temperature range of 100 to 1,000° C., and preferably 200 to 500° C. for 1 minute to 24 hours, and preferably for 30 minutes to 1 hour. Here, the heat treatment is performed under a gas atmosphere by applying a nitrogen partial pressure or an oxygen partial pressure of 100 to 500 Torr or under vacuum.

Lattices in the resistance-variable layer 120 comprising the oxide films having different composition ratios are rearranged by the heat treatment.

If the heat treatment is performed below the above-described range, the rearrangement of the lattices in the resistance-variable layer 120 comprising the three oxide films is not facilitated, whereas, if it is performed above the above-described range, the composition of each oxide film in the resistance-variable layer 120 becomes different or oxygen is discharged to the outside.

Referring to FIG. 4, an upper electrode 130 is formed on the resistance-variable layer 120.

The upper electrode 130 comprises at least one selected from the group consisting of Pt, Au, Al, Cu, Ti, and alloys thereof, a nitride electrode material such as TiN, WN, etc., and an oxide electrode material such as $In_2O_3$:Sn (ITO), $SnO_2$:F (FTO), $SrTiO_3$, $LaNiO_3$, etc. The upper electrode 130 formed on the resistance-variable layer 120 is patterned using a shadow mask or by a dry etching process.

The upper electrode 130 is formed by any one of the above-described deposition methods suggested in the formation of the lower electrode 110.

The ReRAM device produced by the above-described steps may be further subjected to a baking process or an annealing process, if necessary.

Since the lower electrode 110, the upper electrode 130, and the resistance-variable layer 120 comprising the three oxide films are formed by the continuous deposition process, the production of the above-described ReRAM according to the present invention can be advantageously simplified. Moreover, since the resistance-variable layer 120 comprises the oxide films formed of the same type of oxide and having different compositions of oxygen, a separate cleaning process after forming an oxide film is not required to form another type of oxide film. Further, since the formation of the resistance-variable layer 120 is performed under a vacuum atmosphere, the resistance-variable layer 120 is not exposed to atmospheric conditions when a perovskite oxide and a binary oxide is adopted in the prior art, thereby minimizing the contamination of the surface of the thin film structure due to the presence of oxygen.

The ReRAM device according to the present invention has a structure in which the three oxide films are sequentially stacked to form the resistance-variable layer 120. Moreover, the adjacent oxide films are formed of the same type of oxide and have different compositions of oxygen. This nonvolatile ReRAM device has a resistance ratio (i.e., on/off ratio) of 5 to 50.

Furthermore, when the resistance-variable layer 120 comprises three oxide films, the set/reset voltage characteristics is improved compared to a conventional film comprising only $TiO_2$, the set state and the reset state can be controlled according to the change in the polarity of the operating voltage, and the multi-level resistance can be achieved.

PREPARATION EXAMPLE 1

A lower electrode is formed of Pt on a Si substrate by a sputtering process. The thickness of the formed lower electrode is 100 nm.

A first oxide film is formed of $TiO_2$ on the lower electrode by the sputtering process. The thickness of the first oxide film is 10 nm. A second oxide film having a thickness of 50 nm is formed on the first oxide film. The second oxide film is formed of $TiO_{2-x}$ (x is 0.6 to 1) by the sputtering process. Then, a third oxide film is formed on the second oxide film. The third oxide film is formed of $TiO_2$ having a thickness of 10 nm by the sputtering process.

An upper electrode is formed on the resistance-variable layer comprising $TiO_2/TiO_{2-x}/TiO_2$. The upper electrode is formed of Pt having a thickness of 100 nm by the sputtering process.

Figure 5:
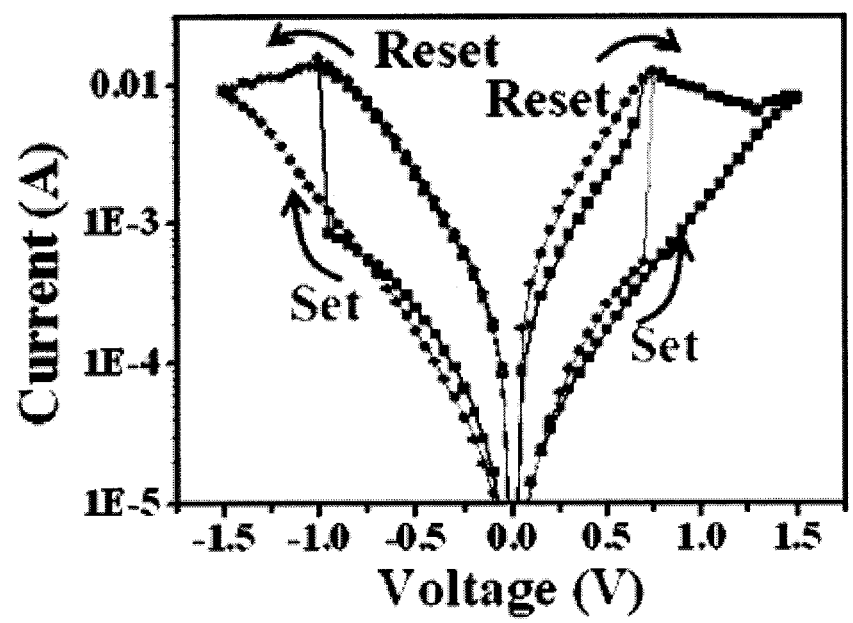
FIG. 5 is a graph showing voltage-current characteristics of a ReRAM device prepared in Preparation Example 1.

FIG. 5 is a graph showing voltage-current characteristics of the ReRAM device prepared in this Preparation Example.

Referring to FIG. 5, a voltage in a range from a negative voltage of −1 V to a positive voltage of +1.5 V or in a range from a positive voltage of +1 V to a negative voltage of −1.5 V is gradually applied to the ReRAM device prepared in this Preparation Example.

First, the graph shown as ■ is a graph showing the current characteristics of the ReRAM device obtained by applying a voltage in the range from −1 V to +1.5 V to the ReRAM device. When a voltage in a range from 0 V to −1 V is applied to the ReRAM device in a high resistance state as an initial state, the high resistance state is changed to a low resistance state at −1 V and, when a voltage in a range from −1 V to +1.5 V is applied to the ReRAM device, the ReRAM device is changed to a low resistance state near +0.8 V and changed to the initial high resistance state at a final voltage of +1.5 V, from which it can be seen that the resistance stat of the resistance-variable layer is changed by applying specific negative and positive voltages.

Moreover, the graph shown as ● is a graph showing the current characteristics of the ReRAM device obtained by applying a voltage in the range from +1 V to −1.5 V to the ReRAM device. When a voltage in a range from 0 V to +0.7 V is applied to the ReRAM device in a high resistance state as an initial state, the high resistance state is changed to a low resistance state at +0.7 V and, when a voltage in a range from +0.7 V to −1.5 V is applied to the ReRAM device, the ReRAM device is changed to a low resistance state near −1 V and changed to the initial high resistance state at a final voltage of −1.5 V.

Therefore, when a read voltage in a range of 0.2 V to 0.5 V is applied to the ReRAM device based on the resistance states and the change in the applied voltage, it is possible to read information according to the resistances of four states.

PREPARATION EXAMPLE 2

In this Preparation Example, the lower electrode and the upper electrode are formed of the same material as in Preparation Example 1. However, the oxide films are formed of $TiO_{2-x}$ (x is 0.6 to 1) having a thickness of 10 nm, instead of $TiO_2$, and $TiO_2$ having a thickness of 50 nm, instead of $TiO_{2-x}$. As a result, the resistance-variable layer of the ReRAM prepared in this Preparation Example has a structure of $TiO_{2-x}/TiO_2/TiO_{2-x}$.

Figure 6:
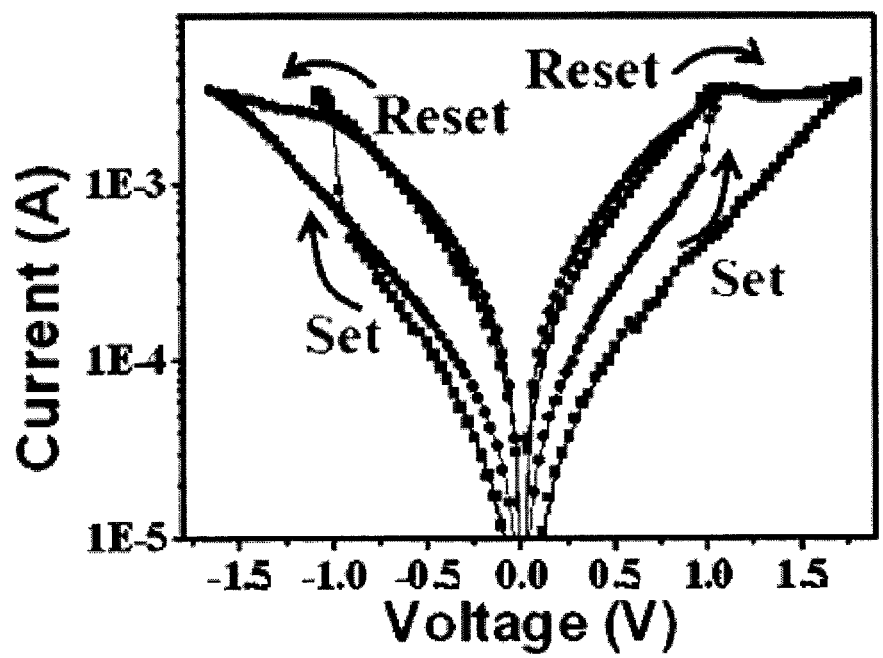
FIG. 6 is a graph showing voltage-current characteristics of a ReRAM device prepared in Preparation Example 2.

FIG. 6 is a graph showing voltage-current characteristics of the ReRAM device prepared in Example 2.

Referring to FIG. 6, a voltage in a range from a negative voltage of −1.2 V to a positive voltage of +1.8 V or in a range from a positive voltage of +1 V to a negative voltage of −1.8 V is gradually applied to the ReRAM device prepared in this Preparation Example.

In FIG. 6, the graph shown as ■ is a graph showing the current characteristics of the ReRAM device obtained by applying a voltage in the range from −1.2 V to +1.8 V to the ReRAM device. When a voltage in a range from 0 V to −1.2 V is applied to the ReRAM device in a high resistance state as an initial state, the resistance is reduced at about −1 V and changed from the initial high resistance state to a low resistance state at a final voltage of −1.2 V and, when a voltage in a range from −1.2 V to +1.8 V is applied to the ReRAM device, the ReRAM device is changed to a low resistance state near +1 V and changed to the initial high resistance state at a final voltage of +1.8 V, from which it can be seen that the resistance stat of the resistance-variable layer is changed by applying specific negative and positive voltages.

Moreover, the graph shown as ● is a graph showing the current characteristics of the ReRAM device obtained by applying a voltage in the range from +1 V to −1.8 V to the ReRAM device. When a voltage in a range from 0 V to +1 V is applied to the ReRAM device in a high resistance state as an initial state, the high resistance state is changed to a low resistance state at +1 V and, when a voltage in a range from +1 V to −1.8 V is applied to the ReRAM device, the ReRAM device is changed to a low resistance state near −1 V and changed to the initial high resistance state at a final voltage of −1.8 V.

Therefore, when a read voltage in a range of 0.2 V to 0.5 V is applied to the ReRAM device based on the resistance states and the change in the applied voltage, it is possible to read information according to the resistances of four states.

As described above, it is possible to control the set state and the reset state according to the level of the applied voltage and the change in the polarity of the applied voltage, thereby achieving the multi-level resistance. Thus, it can be seen that it is possible to produce a multi-level ReRAM.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

The invention claimed is:

1. A resistive random access memory (ReRAM) device comprising:
    a substrate;
    a lower electrode formed on the substrate;
    a resistance-variable layer comprising a first oxide film, a second oxide film, and a third oxide film sequentially stacked on the lower electrode and formed of the same type of oxide, and in which adjacent oxide films in the resistance-variable layer have different composition ratios, wherein the first oxide film and the third oxide film are stoichiometric layers which satisfy the stoichiometry of oxygen and the second film is a nonstoichiometric layer which has a deficient composition of oxygen compared with the stoichiometric layers; and
    an upper electrode formed on the resistance-variable layer.

2. The ReRAM device of claim 1, wherein the first oxide film and the third oxide film comprise $TiO_2$, $MgO$, $NiO$, $ZnO$, or $HfO_2$ and the second oxide film comprises $TiO_{2-x}$ where ($0.6 \leq x \leq 1$), $MgO_{1-x}$ where ($0.3 \leq x \leq 0.7$), $NiO_{1-x}$ where ($0.3 \leq x \leq 0.7$), $ZnO_{1-x}$ where ($0.3 \leq x \leq 0.7$), or $HfO_{2-x}$ where ($0.6 \leq x \leq 1$).

3. The ReRAM device of claim 2, wherein the resistance-variable layer has a thickness of 5 to 150 nm.

4. The ReRAM device of claim 2, wherein the first oxide film, the second oxide film, and the third oxide film of the resistance-variable layer have different thicknesses.

5. A method for producing a resistive random access memory (ReRAM) device, the method comprising:
    forming a lower electrode on a substrate;
    forming a first oxide film on the lower electrode;
    forming a second oxide film on the first oxide film, the second oxide film being formed of the same type of oxide as the first oxide film and having a lower composition ratio of oxygen than that of the first oxide film;
    forming a third oxide film on the second oxide film, the third oxide film being formed of the same type of oxide as the second oxide film and having a higher composition ratio of oxygen than that of the second oxide film;
    performing heat treatment for the first oxide film, the second oxide film and the third oxide film; and
    forming an upper electrode on the third oxide film.

6. The method of claim 5, wherein the first oxide film and the third oxide film have stoichiometric composition of oxygen and the second oxide film has nonstoichiometric composition of oxygen.

7. The method of claim 5, wherein the heat treatment is performed at 100 to 1,000° C.

8. The method of claim 5, wherein the heat treatment is performed under a gas atmosphere by applying a nitrogen partial pressure or an oxygen partial pressure of 100 to 500 Torr or under vacuum.

* * * * *